US012622071B2

(12) United States Patent
Angel et al.

(10) Patent No.: US 12,622,071 B2
(45) Date of Patent: May 5, 2026

(54) BIFACIAL PV MODULE HYBRIDIZED WITH III-V PV CELLS

(71) Applicant: Arizona Board of Regents on Behalf of the University of Arizona, Tucson, AZ (US)

(72) Inventors: James Roger P. Angel, Tucson, AZ (US); Nicholas Didato, Tucson, AZ (US); Joel Berkson, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 18/858,892

(22) PCT Filed: Apr. 21, 2023

(86) PCT No.: PCT/US2023/019423
§ 371 (c)(1),
(2) Date: Oct. 22, 2024

(87) PCT Pub. No.: WO2023/205434
PCT Pub. Date: Oct. 26, 2023

(65) Prior Publication Data
US 2025/0280609 A1      Sep. 4, 2025

Related U.S. Application Data

(60) Provisional application No. 63/333,943, filed on Apr. 22, 2022.

(51) Int. Cl.
| | |
|---|---|
| *H10F 19/80* | (2025.01) |
| *H10F 77/42* | (2025.01) |
| *H10F 77/63* | (2025.01) |

(52) U.S. Cl.
CPC ......... *H10F 19/807* (2025.01); *H10F 77/484* (2025.01); *H10F 77/63* (2025.01)

(58) Field of Classification Search
CPC ........ H10F 77/40; H10F 77/42; H10F 77/484; H10F 77/63; H10F 19/807
See application file for complete search history.

(56) References Cited

U.S. PATENT DOCUMENTS 5,118,361 A * 6/1992 Fraas ................... H10F 77/484
438/65
2008/0110491 A1 5/2008 Buller et al.
(Continued)

FOREIGN PATENT DOCUMENTS

WO      2021/062010 A1     4/2021

OTHER PUBLICATIONS

Lee et al., "Concentrator photovoltaic module architectures with capabilities for capture and conversion of full global solar radiation", PNAS, (Dec. 5, 2016), pp. E8210-E8218.
(Continued)

*Primary Examiner* — Mayla Gonzalez Ramos
(74) *Attorney, Agent, or Firm* — Venable LLP; Ryan Ward

(57) ABSTRACT

A hybrid photovoltaic (PV) module includes a bifacial PV module that has an upper sheet of glass, a lower sheet of glass arranged spaced apart and substantially parallel to the upper sheet of glass, and a plurality of PV cells sandwiched between the upper and lower sheets of glass. The upper sheet of glass has an outside surface on an opposite side from the plurality of PV cells. The hybrid PV module also includes a plurality of copper wires bonded to the outside surface of the upper sheet of glass so as to extend across a width thereof: a plurality of multijunction (MJ) PV cell assemblies positioned and bonded to the outside surface of the upper glass
(Continued)

15

16 sheet, each MJ cell assembly of the plurality of MJ cell assemblies including an MJ cell, a secondary optical assembly and first and second conductive connectors, each being electrically and thermally connected to the MJ cell and to at least a respective one of the plurality of copper wires; and an upper lens array of a full size of the bifacial PV module and being attached in position there above.

3 Claims, 12 Drawing Sheets

(56)                     References Cited

U.S. PATENT DOCUMENTS

| | | | |
|---|---|---|---|
| 2010/0218805 | A1 | 9/2010 | Everett et al. |
| 2011/0273783 | A1* | 11/2011 | Campbell ............ G02B 3/0056 |
| | | | 359/708 |
| 2013/0182333 | A1 | 7/2013 | Meitl et al. |
| 2014/0130842 | A1 | 5/2014 | Castillo-Aguilella et al. |
| 2015/0243797 | A1* | 8/2015 | Nagai ................... H10F 19/902 |
| | | | 136/244 |
| 2016/0056758 | A1 | 2/2016 | Gilbert et al. |
| 2021/0288607 | A1 | 9/2021 | Moslehi |
| 2022/0069767 | A1 | 3/2022 | Graner |
| 2022/0231180 | A1* | 7/2022 | Gerlich ................... H02S 10/30 |

OTHER PUBLICATIONS

NREL, 2022, Best Research Cell Efficiency (Rev. Sep. 23, 2024).

* cited by examiner

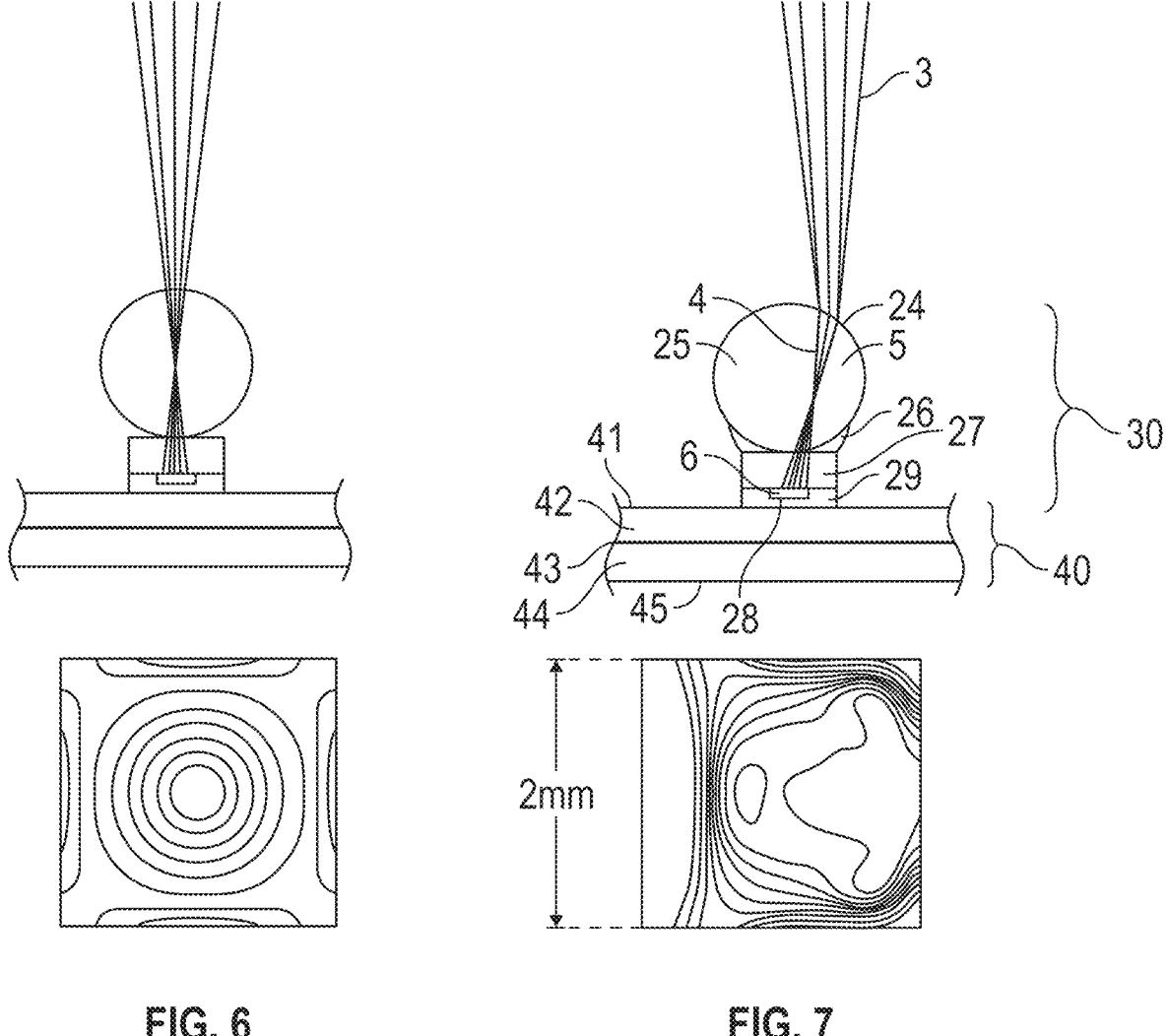
FIG. 6                                    FIG. 7

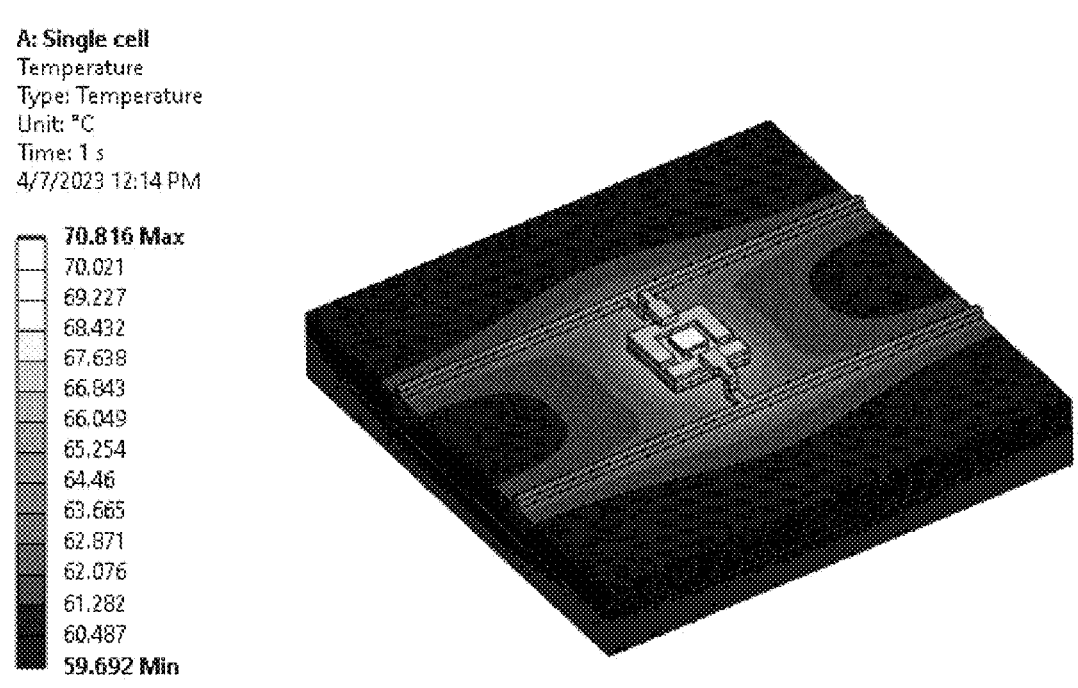
FIG. 11
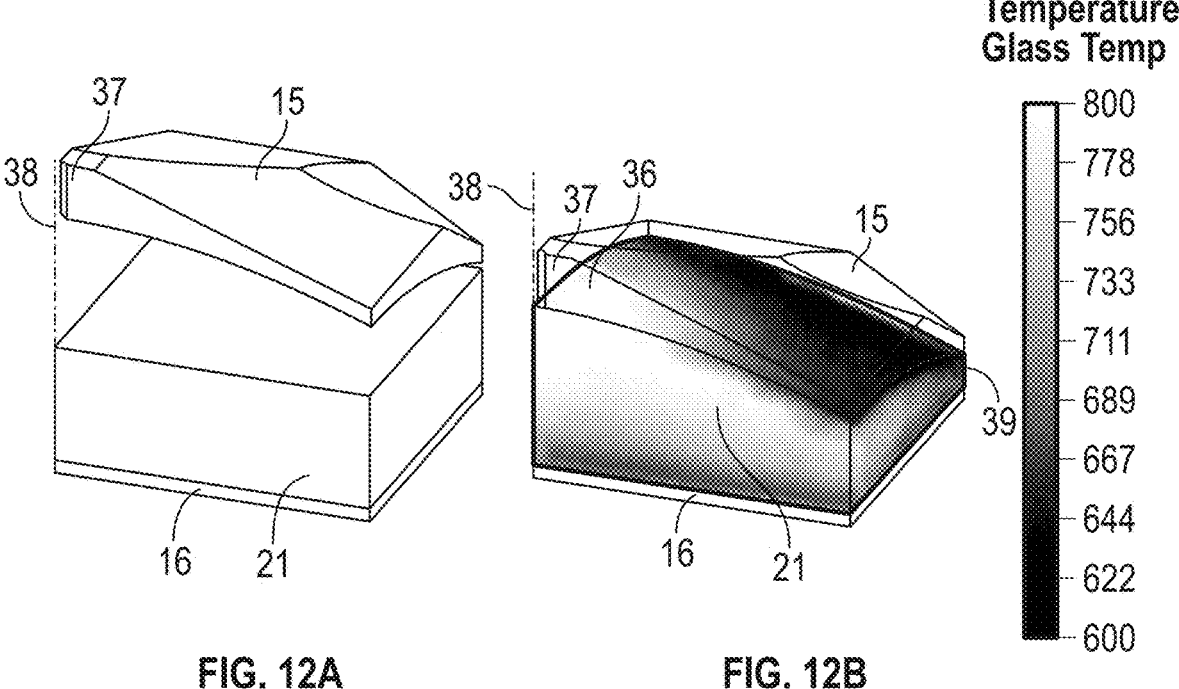
FIG. 12A            FIG. 12B

(a)                (b)

BIFACIAL PV MODULE HYBRIDIZED WITH III-V PV CELLS

CROSS-REFERENCE OF RELATED APPLICATION

This application is a U.S. National Stage of PCT/US2023/019423, filed Apr. 21, 2023, which claims priority to U.S. Provisional Application No. 63/333,943 filed Apr. 22, 2022; the entire contents of which are hereby incorporated by reference.

BACKGROUND

1. Technical Field

The field of currently claimed embodiments of this invention relates to photovoltaic (PV) modules, and more particularly to bifacial PV modules adapted for higher conversion efficiency by the addition of multijunction PV cells and glass lens arrays.

2. Discussion of Related Art

A photovoltaic (PV) module is a device to convert sunlight and daylight into electricity. PV modules typically are made with a glass sheet supporting and protecting a thin layer of semiconductor material, commonly silicon. For utility scale generation they are typically turned about a horizontal axis through the day to face the sun as it moves across the sky. In some cases, silicon PV cells are sandwiched between two glass sheets to form a bifacial module which converts reflected sunlight from behind as well as direct and diffuse sunlight from in front. They are limited in their conversion efficiency of sunlight energy into electricity because they commonly use only one semiconductor type, and hence convert only a part of the solar spectrum. Conversion efficiency of PV cells may be much increased by use of tandem or multijunction (MJ) cells, in which a stack of two or more different types of semiconductor collectively harvest energy more efficiently across the full solar spectrum, and also by concentrating the sunlight on the cells. Thus, the best tandem silicon-perovskite PV cells have been measured with 32.9% efficiency in non-concentrated sunlight, and the best 4-junction cells at 665× concentration at 47.6% (NREL, 2022, *Best Research Cell Efficiency*). MJ cells are more expensive, per unit area, than the silicon cells used in most PV modules. However, they become less expensive, per unit of electrical power generated, when greatly reduced in size and powered by concentrated spots of focused sunlight. But in the past, PV modules using multijunction cells under concentrated sunlight have not realized enough increase in energy output to offset their additional costs. To date, no company has been able to exploit multijunction PV cells under concentrated sunlight to successfully compete commercially in large scale generation with existing directly illuminated PV modules that are manufactured in huge volume at low cost, and with the full advantage of economy of scale.

In some recent related art, test modules using multijunction cells under focused sunlight have obtained somewhat improved conversion efficiency by incorporating additional silicon cells. In these hybrid modules, the silicon cells convert into electricity the energy of diffuse light, which is not focusable. The separation of diffuse and direct sunlight is made by lenses that focus direct sunlight onto the multiple multijunction cells while also transmitting diffuse light to full-area PV cells. The types of lenses commonly used in prior art are Fresnel and plastic lenses, (Lee et al., "*Concentrator photovoltaic module architectures with capabilities for capture and conversion of full global solar radiation*", PNAS Dec. 5 2016), Meitl et al, 2013, US 2013/0182333 A1. However, these lenses are not highly transmissive for either direct or diffuse light. The complexity and cost of these prototype hybrid modules has prevented commercial adoption. In a prior art invention, PCT/US2020/052522, Apparatus and Method for the Manufacture of Large Glass Lens Arrays, the entire content of which is incorporated herein by reference. Angel et al describe methods for forming highly transmissive arrays of conventional (not Fresnel) glass lenses. In one of these methods, flat or cylindrical molds are used to emboss arrays of adjacent plano-convex spherical lenses. FIG. 1 illustrates rollers 15 (upper) and 16 (lower) to emboss a continuous glass sheet. However, a potential difficulty identified with molding a parquet of lenses is entrapment of gas at the crown of the inverted concave cups, as soft glass is pressed up into each cup to form the crown of the lens surface. Thus, there remains a need for approaches for PV modules using such arrays that can provide higher conversion efficiency, and that can be cost effective for generation at commercial and utility scale.

SUMMARY

A hybrid photovoltaic (PV) module according to some embodiments of the current invention include a bifacial PV module that has an upper sheet of glass, a lower sheet of glass arranged spaced apart and substantially parallel to the upper sheet of glass, and a plurality of PV cells sandwiched between the upper and lower sheets of glass. The upper sheet of glass has an outside surface on an opposite side from the plurality of PV cells. The hybrid PV module also includes a plurality of copper wires bonded to the outside surface of the upper sheet of glass so as to extend across a width thereof: a plurality of multi-junction (MJ) PV cell assemblies positioned and bonded to the outside surface of the upper glass sheet, each MJ cell assembly of the plurality of MJ cell assemblies including an MJ cell, a secondary optical assembly and first and second conductive connectors, each being electrically and thermally connected to the MJ cell and to at least a respective one of the plurality of copper wires; and an upper lens array of a full size of the bifacial PV module and being attached in position there above. When the hybrid PV module is oriented to face the sun, each lens of the upper lens array focuses direct sunlight onto a respective one of the plurality of MJ cell assemblies while transmitting diffuse light to the bifacial PV module. The copper wires and connectors are structured to provide at least two functions, namely to: conduct electrical power of the MJ cells to a perimeter of said hybrid PV module and thence via additional electrical wiring to an external circuit, and conduct and spread heat from the plurality of MJ cell assemblies across the upper sheet of glass of the bifacial PV module so that the module serves as a heat sink for the plurality of MJ cells assemblies thereby providing passive convective cooling from the lower sheet of glass and thus preventing overheating and increasing optical to electrical conversion efficiency without incurring an added complexity and cost of added heat sinks or active cooling and parasitic electrical power loss.

A method for manufacturing a planar array of multiple adjacent plano-convex lenses according to some embodiments of the current invention includes pressing a hot, soft sheet of glass using a mold having first and second surfaces, the first surface being flat and the second surface being quilted, the quilted mold surface provided with adjacent concave cups, each shaped to form an individual convex lens surfaces and having a central vent hole: continuing to apply pressure to move the softened glass locally inward from edges to centers of each lens mold to form completely each lens and expelling trapped gas through each corresponding central vent hole; and annealing and cooling the array of molded lenses to provide the planar array.

An optical solar concentrator according to some embodiments of the current invention includes a lens array that has a plurality of primary glass convex entry lenses arranged in an adjacent configuration, each of the primary glass convex lenses having a coplanar flat first surface and a convex second surface: a flat glass plate arranged proximate and substantially parallel to the lens array; and a plurality of secondary lenses of short focal length supported from the flat glass plate proximate an axial focus of each one of the plurality of primary glass convex lenses. The light exiting each secondary lens is concentrated with greater than 200× geometric concentration relative to direct sunlight entering the entry lens, and no more than 10% geometric loss of focused power for sunlight entering at up to 1 degree off-axis.

BRIEF DESCRIPTION OF THE DRAWINGS

FIG. 6 is a ray diagram and cell illumination pattern for orientation directly to the sun according to an embodiment of the current invention;

FIG. 7 is a ray diagram and cell illumination pattern for orientation one degree off axis according to an embodiment of the current invention:

FIG. 11 shows temperature distribution around a MJ cell assembly from a finite element according to an embodiment of the current invention:

FIGS. 12A-12B show a model of mold and glass for a quarter section of one lens out of an array of square lenses, according to an embodiment of the current invention. FIG. 12A prior to molding, FIG. 12B after completion of molding in 1 second, with glass temperature from a finite element model represented by gray-scale:

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed, and other methods developed, without departing from the broad concepts of the present invention. All references cited anywhere in this specification are incorporated by reference as if each had been individually incorporated.

A configuration to efficiently and economically convert substantially all available light into electricity is one that combines single junction and multijunction PV cells. An embodiment of the current invention is built around a complete bifacial PV module, which uses single-junction PV cells, for example silicon, sealed between thin glass windows. In this embodiment, a bifacial module is used not only to harvest the energy of diffuse light, but also to carry and cool an array of small multijunction. III-V PV cells to harvest direct sunlight with very high conversion efficiency. By using the multijunction cells to provide for more efficient conversion of the direct sunlight spectrum, while at the same time the bifacial module continues to convert diffuse light from both sides, the overall conversion efficiency of the module is increased according to some embodiments of the current invention.

The small MJ cells are mounted to the bifacial module's front window on small ceramic substrates. An array of lenses molded into a single sheet of glass is attached to the front of the apparatus to concentrate direct sunlight onto each of the MJ cells while transmitting diffuse light to the PV cells within the bifacial module. In one embodiment, a rapid molding process for manufacturing the lens arrays is used in which relatively cold molds are used to form the lenses into a sheet of hot, soft glass. To improve optical coupling efficiency and provide tolerance to mis-pointing, the concentrating optics include a small secondary glass lens and a flat glass plate bonded to the MJ cell.

Figure 2A:
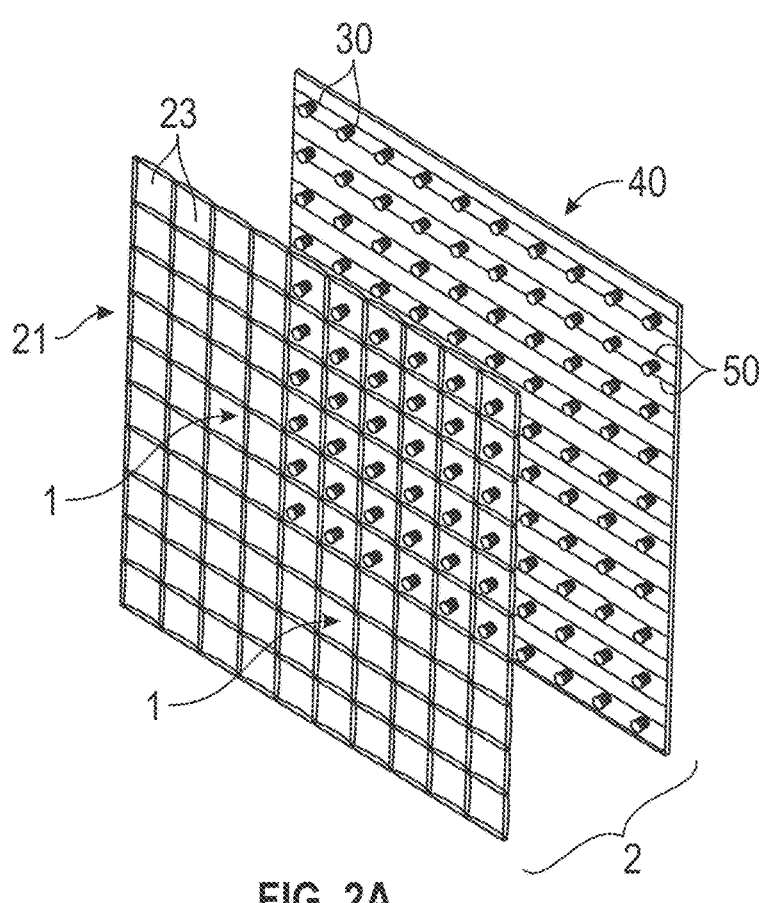
FIG. 2A is a schematic illustration providing a 3D view of a section of a module according to an embodiment of this invention.

FIG. 2A is a schematic 3D view of a square subsection 2 of an embodiment of the current invention in which sunlight 1 enters a hybrid module incorporating a sheet of glass 21 imprinted with a grid of square entry lenses 23 that are placed in front of a bifacial PV module 40. Assemblies 30, each one including a ball lens and a multijunction PV cell are attached to the module 40, one below each entry lens 23 to receive the focused direct sunlight 1.

Electrical power from the MJ cells is conducted to the edge of the module by copper wires 50 attached also to the entrance window of the bifacial module 40. In this embodiment of the current invention, cooling of the multijunction cells, to maintain their high conversion efficiency, is accomplished by conduction of heat through the base module's glass windows and PV cells. To facilitate the heat flow; copper wires 50 attached to the III-V cells are configured to conduct away from the assemblies 30 heat as well as electrical power. In this embodiment, thermally conductive adhesive is used to bond these wires, as well as the cell substrates, to the front glass window of the bifacial module.

Figure 3:
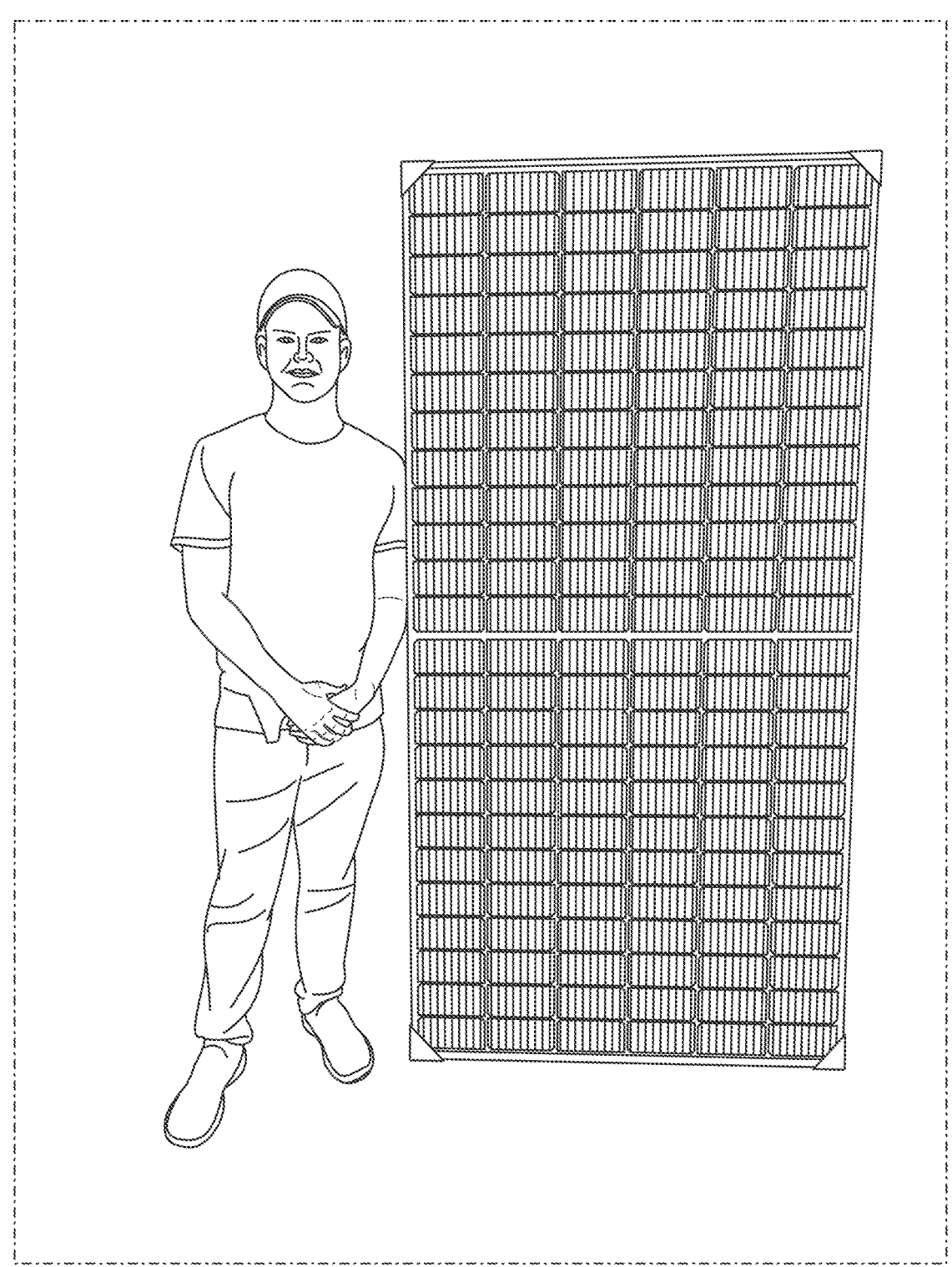
FIG. 3 shows an image of a manufactured bifacial PV according to an embodiment of the current invention.
Figure 4:
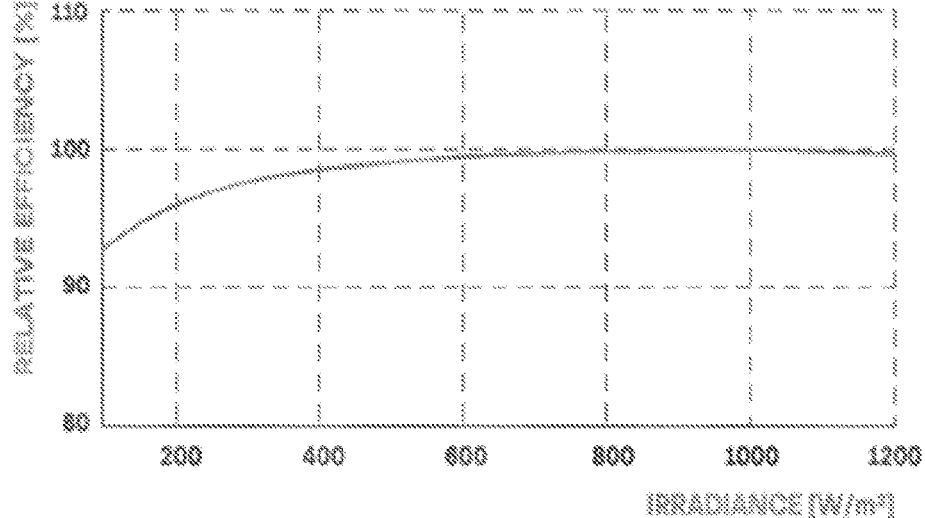
FIG. 4 shows a plot of relative efficiency vs irradiance of a bifacial PV module according to an embodiment of the current invention.

The starting point for some embodiments of this invention is a commercially manufactured bifacial module as shown in FIG. 3. It uses silicon PV cells sandwiched between 2 mm thick glass sheets, so that light is received from both front and back. The single sheet front glass face is approximately 2 meters long and 1 meter wide. Bifacial modules are well matched for hybridization according to some embodiments of this invention, for two reasons. First, they are optimized for high efficiency at low irradiance, as needed for efficient conversion of diffuse radiation alone (FIG. 4). In this example, at 200 W/m², typical of diffuse radiation, the efficiency is still 96% of its maximum of 20.7% at 1000 W/m², at 25° C. The temperature coefficient for output power is a loss of 0.34% per degree C. of temperature above 25° C. Secondly, the thin glass windows of bifacial modules with silicon sandwiched between them have a low enough thermal resistance that they can be adapted to act as efficient heat sinks.

Optical Design.

Figure 5:
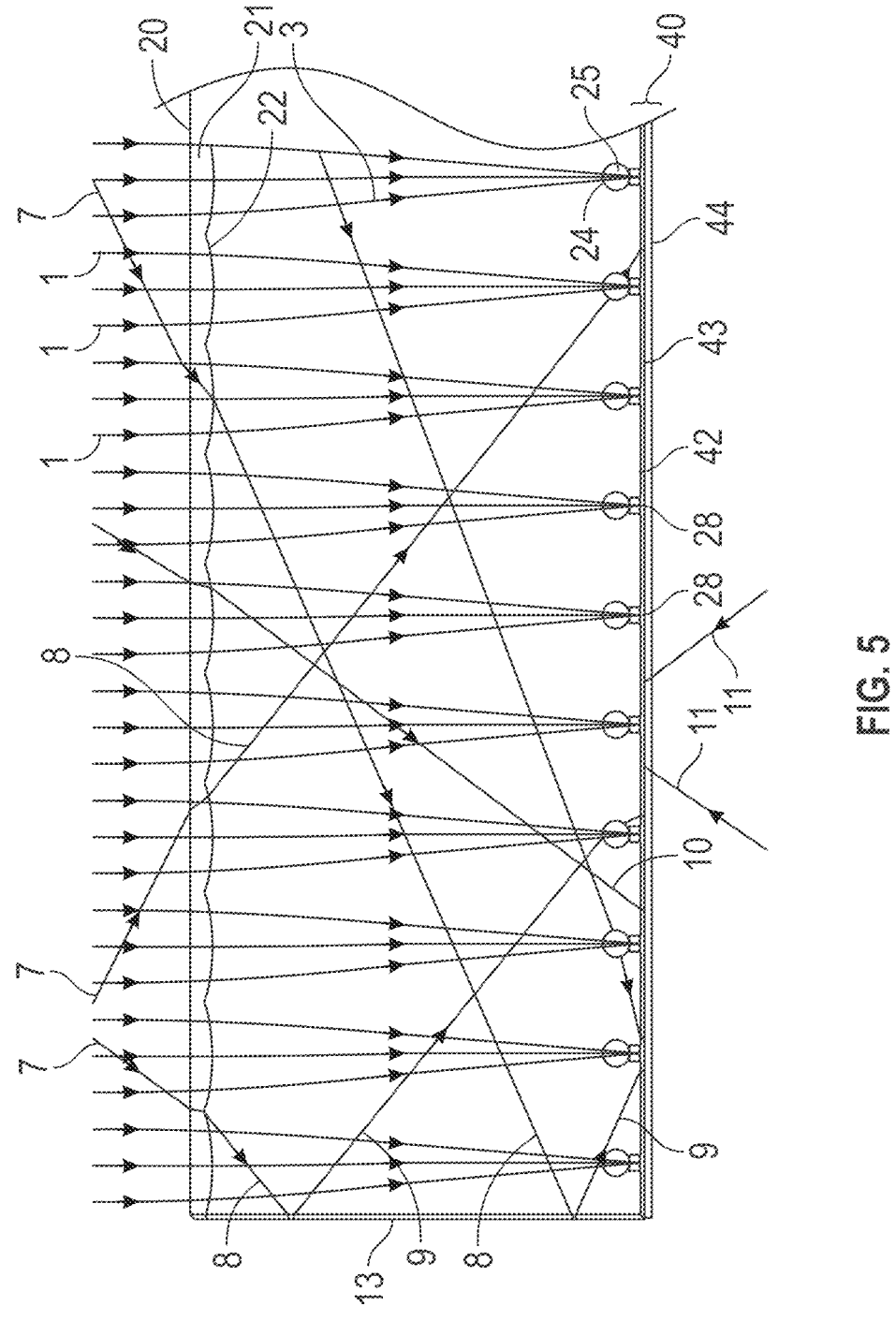
FIG. 5 is a ray diagram showing a detail of an embodiment of the current invention.

FIG. 5 is a ray diagram of an embodiment based on a bifacial module with silicon PV cells. Incoming rays of direct sunlight 1 and diffuse light 7 are separated by the lens array 21 and directed respectively to III-V multijunction PV cells 28 and silicon cells 42. The rays 1 and 7 enter the first, flat front surface 20 of the glass sheet 21 and are transmitted through to the second surface 22, which is shaped in the form of an array of convex lenses 21. Direct sunlight rays 1 entering normal to the surface 20 are refracted at surfaces 20 and 22 as rays 3, which are brought to foci within ball lenses 25, and are transmitted to the III-V multijunction cells 28 below each ball lens. Rays of indirect light 7 refracted through the glass 21 as rays 8 reach the bifacial module either directly, or via reflection as rays 9 by the mirrored side walls 13, and may pass also through the ball lenses 24. The silicon PV cells 43 of the bifacial module 40 are sandwiched between upper window 42 and a lower window 44, which receives additional rays 11 of diffuse light reflected from below.

Figure 2B:
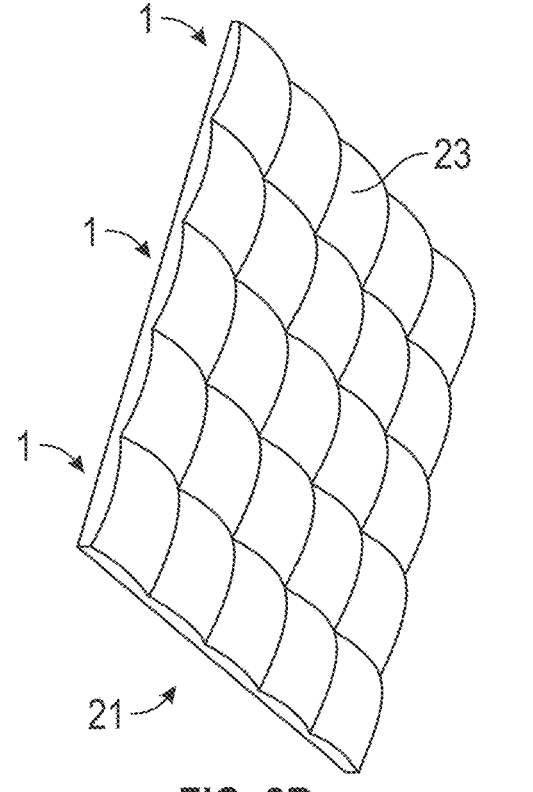
FIG. 2B is 3D view of a section of the module of FIG. 2A.

The optical design parameters of a representative example of this embodiment are listed in Table 1. However, the general concepts of the current invention are not limited to only this example. As an example, molded aspheric secondary lenses could be used instead of spherical ball lenses. In this design, the size of the entry lenses 23 in the array 21 is chosen to be 34 mm square, where a 5×5 lens array measuring 170 mm square is matched to the size of a full silicon cell, or the two adjacent half cells in the example bifacial module of FIGS. 2A, 2B. The total number of lenses and MJ assemblies 30 cells for the bifacial module of FIG. 3, which has 72 full cells, is is then 1,800. The average thickness of the glass 21 is 6 mm, the lenses being 7 mm thick at center, and 2.7 mm in the corners. In this design, the diameter of the ball lenses 25 is chosen to be 8 mm, for optimal concentration of the light from each lens onto a 2 mm×2 mm square multijunction PV cell. The geometric concentration is 290 times.

TABLE 1

Optical Prescription of the concentrating optics of an embodiment

| Surface | Radius | Following material | Position (mm) | Distance to next surface (mm) |
|---|---|---|---|---|
| 20 | infinity | Low-iron soda-lime glass | 0 | 7 |
| 22 | 67 mm | air | 7 | 120 |
| 24 | 4 mm | Low-iron soda-lime glass | 127 | 10 |
| 6 | infinity | MJ cell | 137 | 0 |

The optical design is illustrated in the detailed modeled ray diagrams of FIGS. 6 and 7 of the ball-lens and cell assemblies 30. These show the path of rays from the half-degree diameter disc of the sun for the cases in which it is aligned normal to the lens array (FIG. 6) and when it is oriented 1 degree off the normal (FIG. 7) according to this embodiment of the current invention. The converging rays 3 of direct sunlight from a lens 23 of the array 21 enter the ball surface 24 and are refracted as rays 4 which come to a focus 5 within the ball as an image of the solar disc. The rays continue to exit the ball, pass through optical index matching adhesive 26 and a glass plate 27 below to form an image 6 of the lens 23 on the multijunction cell 28, supported by a ceramic and copper substrate 29. The ball and substrate assembly 30 is bonded to the upper surface 41 of the bifacial module 40.

Contour maps of the irradiance at the 2 mm square cells for the two cases are shown below each of the on-axis and 1° off-axis ray diagrams. The irradiance is given relative to the central peak, at 10% contour intervals. The illumination is calculated for a blackbody spectrum at 5,800° K, like the sun, integrated over the spectral wavelength range from 400 nm to 1,600 nm converted by the multijunction cells, and over the ½ degree diameter disc of the sun. The total fraction of sunlight power incident on a lens 23 over the wavelength rage 400 nm to 1600 nm that is received within the 2 mm square area of the multi-junction cell is 98% for the on-axis case, and 96% for the 1° off-axis case, neglecting dielectric reflection losses.

The high tolerance to mis-pointing quantified above for the design according to this embodiment of the current invention is beneficial, in that it reduces the requirement for tracking accuracy, and hence the cost, for the required dual-axis tracking mounts.

A second feature of this design is the protection afforded to both the silicon and the multi-junction cells by bonded glass coverings. According to one embodiment of the current invention, advantage of this is taken to ship separately and compactly the 7 mm thick glass sheets 21 of molded lenses, and the bifacial modules with attached MJ cell assemblies and wiring. The modified bifacial modules and the lens arrays are then assembled together on site, along with the reflective side walls 13. When fully assembled on a 35 mm thick bifacial module, the hybridized design of Table 1 will be 170 mm thick. But if shipped separately, the total stacked thickness will be only 45 mm, for a 3 times reduction in shipping container count. The bifacial modules with attachments may be stacked for shipping with no increase in their usual thickness, because the cell assemblies 30 on one module fit into the underside of the module stacked above it.

Thermal Management and Electrical Wiring

Because heat from the silicon cells of a bifacial module, which amounts to some 80% of the incident diffuse light energy, it is taken over the full module area, it is adequately transmitted through the 2 mm thick glass windows despite their relatively poor thermal conductivity: By contrast, the heat from the small MJ cells, amounting to some 60% of the direct sunlight energy, is generated over a small area. To avoid local heating, some embodiments of this invention exploit copper wires to achieve adequate cooling of the small cells by thermal conduction of their heat out across the glass.

Figure 8:
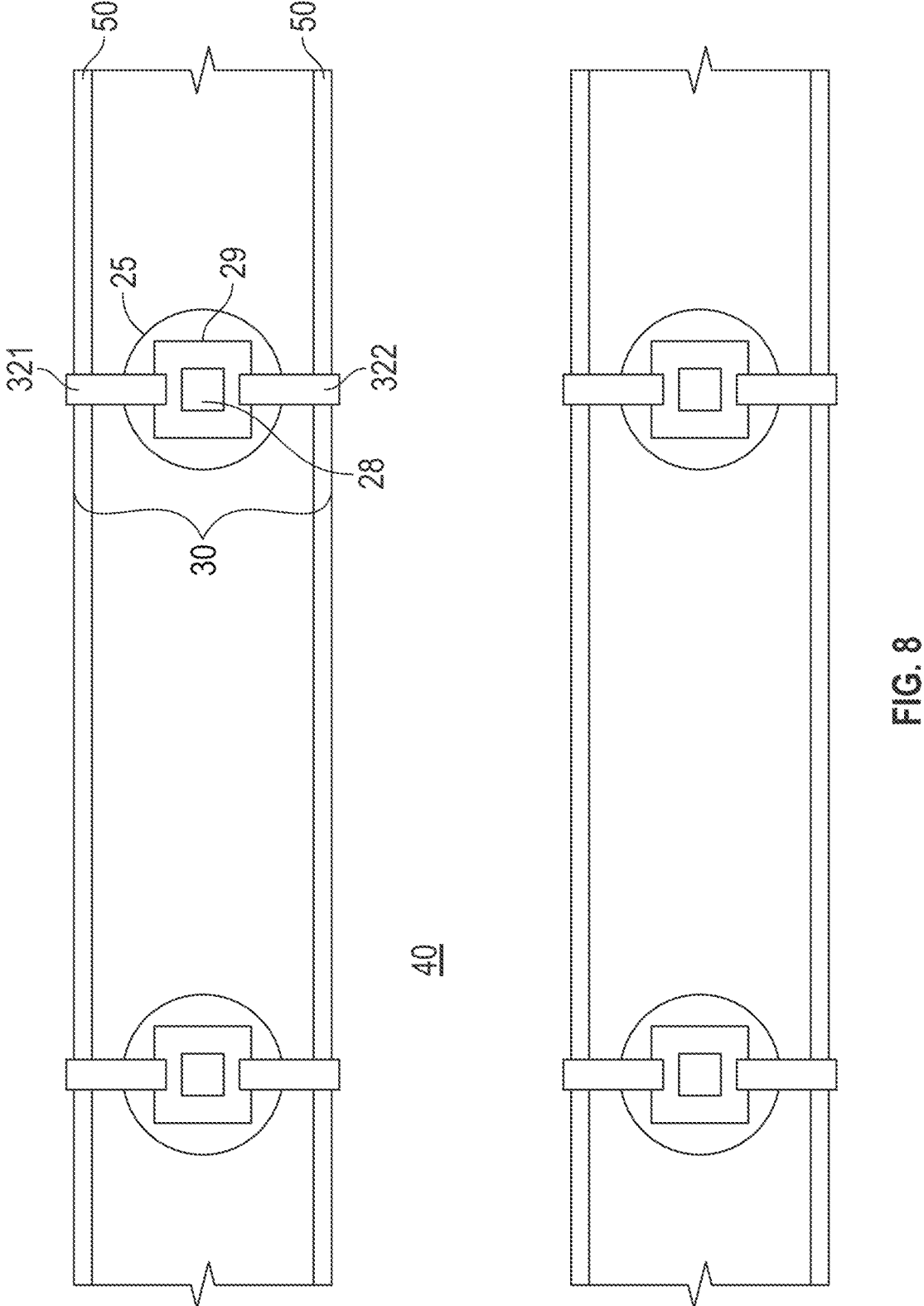
FIG. 8 is a plan view detail of an MJ cell assembly and copper wires according to an embodiment of the current invention.

FIG. 8 illustrates in a plan view a detail of four assemblies 30 (only one labeled for clarity) attached to a bifacial PV module 40 according to an embodiment of the current invention. Copper wires 50 are attached with thermally conductive adhesive to the upper, first face 41 of the module 40, extending across the full width of the bifacial module 40. Two conductive connectors 321 and 322 carry both electrical power and heat from each assembly 30 to the wires 50. The conductive connectors can be copper is some embodiments. However, other metals may be used in other embodiments.

Figure 9:
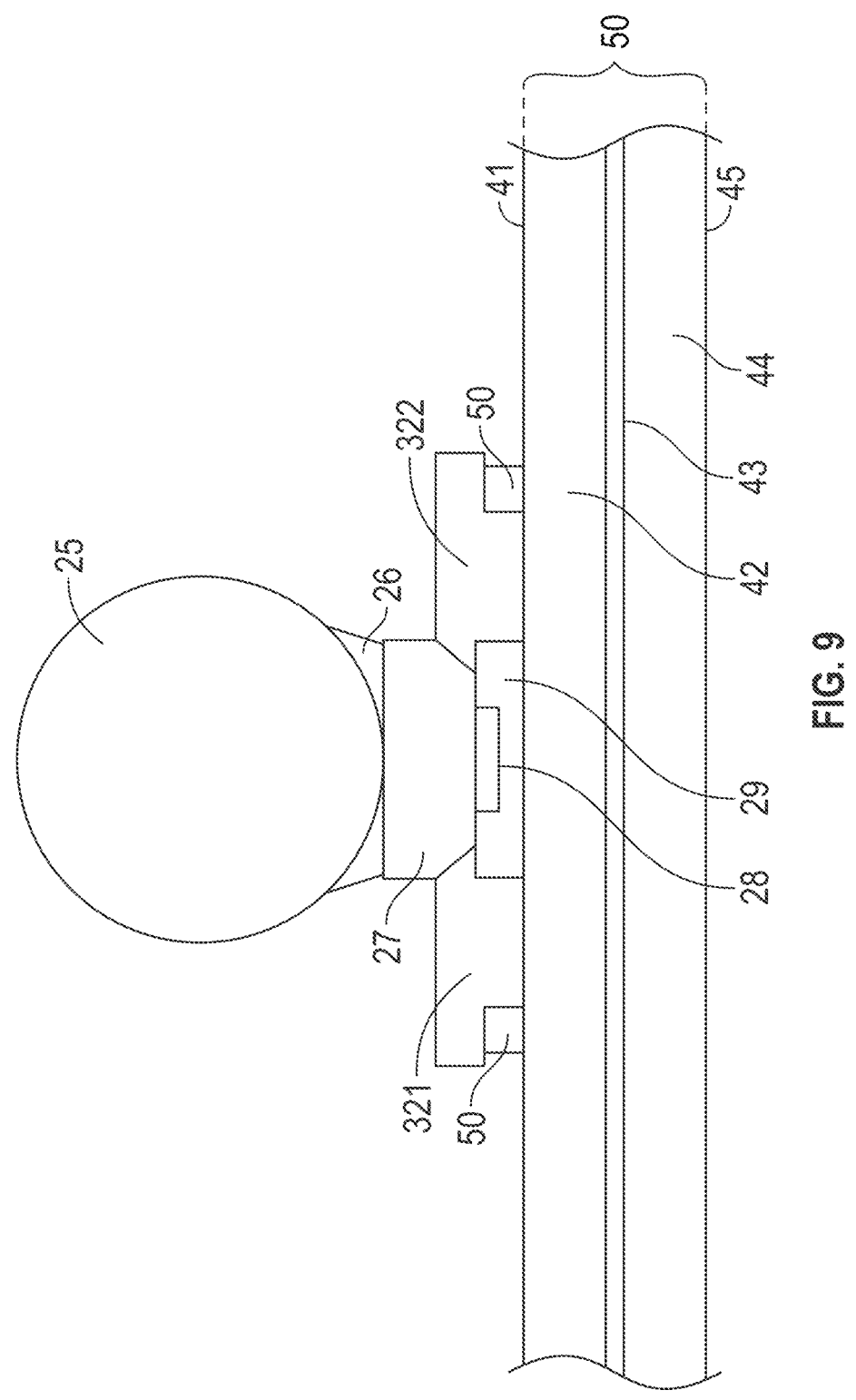
FIG. 9 is a side view of an MJ cell assembly and copper wires according to an embodiment of the current invention.

FIG. 9 shows a side view; looking along the direction of the copper wires 50 of a single assembly 30 attached to the front face 41 of a bifacial module 40. The connecting elements 321 and 322 are bonded with an adhesive that is both thermally and electrically conductive to the copper-ceramic substrate 29 at their first end and copper wires 50 at their second end. In addition, thermally conductive adhesive is used to bond each of the elements 321 and 322 along their length to the front face 41 of the bifacial module 40.

Figure 10:
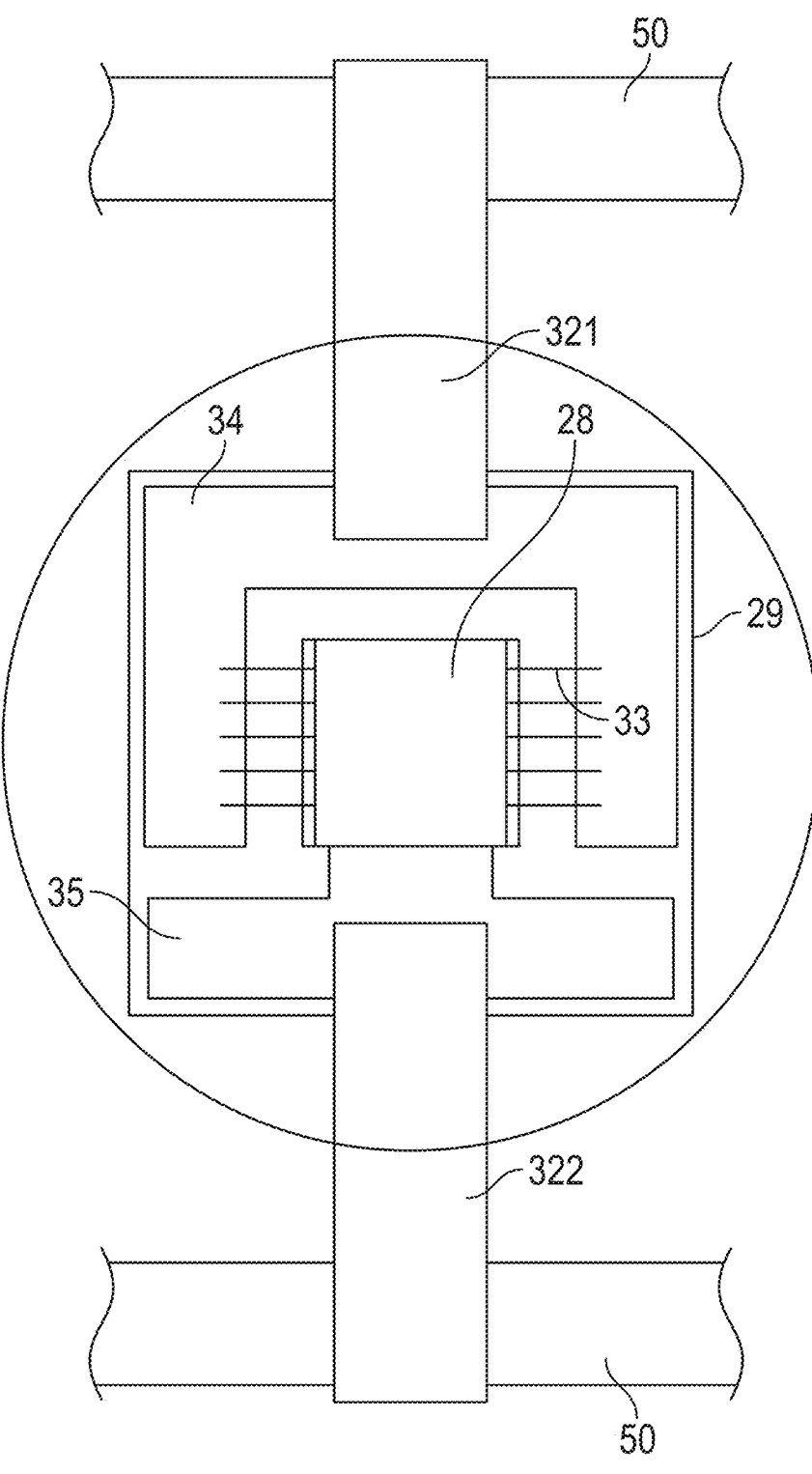
FIG. 10 is a plan view detail of an MJ cell assembly according to an embodiment of the current invention.

FIG. 10 shows a plan view of a single assembly with details of the electrical and thermal connections according to an embodiment of the current invention. Electrical current from the electrodes on the upper side of the MJ cell 28 is carried by wires 33 via the C-shaped copper electrode 34 to the upper connecting element 321. Current from the lower, back electrode of the cell 28 is carried by the back, copper T-shaped electrode 35 to the lower connecting element 322.

Heat from cell 28 is conducted from below through the T-shaped electrode 35 into the copper-ceramic substrate 29, and some of it from there directly downward through the substrate and thermally conductive adhesive into the upper glass window 42 of the bifacial cell. At the same time additional heat from the substrate 29 is conducted via the connecting elements 321 and 322 into the copper wires 50, and thence to the window 42.

The cooling added by exploiting thermal conductivity of the electrical connections may be evaluated quantitatively using the dimensions given for the embodiment described above. The ceramic substrate 29 is 5 mm square, thus heat flowing directly down into the glass face 41 is spread over an area of 25 mm$^2$. By contrast, the two conducting elements 321 and 322 and two 34 mm long segments of the 1 mm square copper wires 50 associated with each cell that contact the glass face 41 together carry heat from each cell over a three times larger area of 76 mm$^2$, quadrupling the area for conduction into the glass. The additional area is valuable, because the temperature drop along the copper is not large compared with the drop through the 2 mm thickness of the front sheet 42. Once the heat reaches the silicon cells 43 under sheet 42 it is spread widely for transmission through the back sheet 44 for convective dissipation since silicon is a good thermal conductor.

The results of a detailed finite element thermal model of an embodiment of this invention are shown in FIG. 11. The overall rise in temperature of multijunction cells over the temperature of the operating environment is 50° C., with only a 10° C. drop in temperature between the cell and the back surface of the bifacial module. The model assumes direct sunlight illumination of 1,000 W/m$^2$, 50% efficient MJ cells, and cooling by convection and radiation from only the back surface 45 of a bifacial module to air and the ground, both taken to be at 20° C. The coupling coefficient corresponds to ~6 W/m$^2$/° C. for each of convection and radiation.

Lens Array Molding

Figure 1:
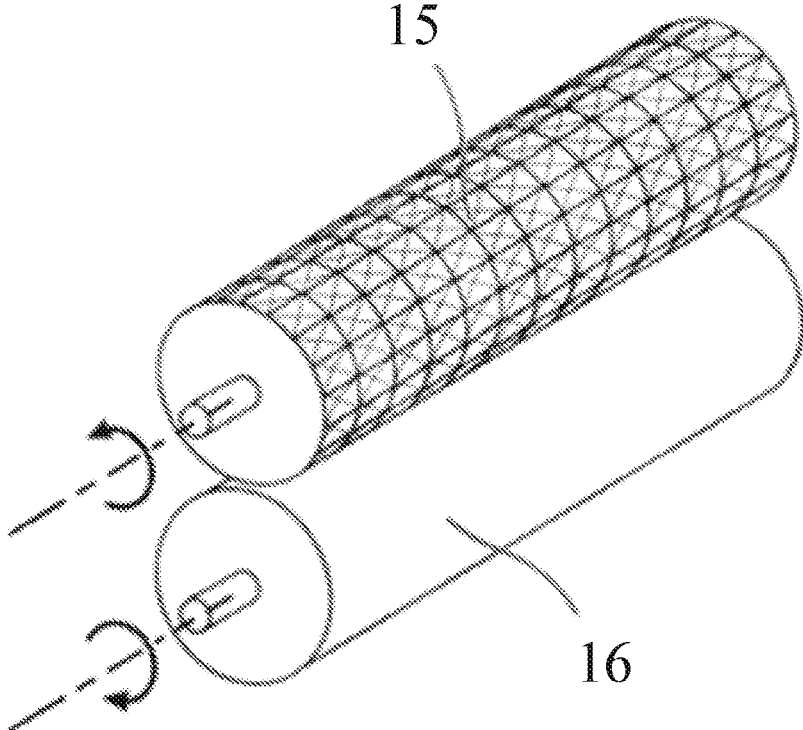
FIG. 1 is a schematic illustration of rollers to emboss a glass sheet as a lens array.

In an embodiment of this invention, an all-glass array of axisymmetric convex lenses is formed by rapid, non-isothermal pressing of a flat, hot, soft glass sheet between two cooler flat or cylindrical steel molds. The upper mold has a quilted surface shaped with adjacent concave sections to form an array of multiple convex lenses. FIG. 1, from prior art (Angel, PCT/US 2020/052522) illustrates this process for the case in which the upper and lower mold surfaces are on rollers 15 and 16.

In an embodiment of this invention, a small hole is provided in the crown of each lens mold to allow trapped gas to escape, as glass flows up to fill the crown. In this way, the glass will take the mold's shape all the way to the crown. The hole has in it a porous plug, so that when the glass does reach it, it does not flow into the hole.

In an embodiment, a flat glass sheet the size of the bifacial module to be hybridized is pressed into an array of square plano-convex lenses using two mold pieces, the first flat, below; and the second, quilted, above. FIGS. 12a-12B show some details of the process, showing just a section of the mold and glass to be formed into a quarter of a single lens. The square lens has a central axis 38, and from symmetry considerations the motion of the glass in all four quadrants about the axis 38 will be the same toward the crown—glass will not flow between the regions being formed into adjacent lenses. FIG. 12A shows a 90 degree corner of the upper mold 15 prior to molding, in position above the glass sheet 21, which is resting on the planar lower mold section 16. FIG. 12B shows the mold sections and glass 21 on completion of molding.

The mold pieces 15 and 16 are first heated to a temperature at or below the glass annealing temperature. The flat glass sheet 21 which is to be molded, float glass with specular surfaces, is heated to near its annealing temperature and placed on the flat, thermally reflective lower mold surface 16. A hot radiating surface, at a temperature of about 1,500° K or more, is then placed directly above said sheet long enough to quickly heat and soften the glass and is then quickly removed. The top mold 15 is then quickly moved into position above the glass, as shown in FIG. 12A, and then brought down and pressed into the glass to shape the lens array. The applied pressure moves the section 21 of softened glass inward from the perimeter to the center of each lens mold, thus forming each lens completely. The gas trapped in the crown of each lens mold escapes through the small hole 37 provided for the purpose. The array thus formed is then removed from the mold and annealed and cooled, while more sheets are formed using the same mold into lens arrays, using the same rapid forming process.

During the pressing, the original specular glass surfaces are preserved even though the mold surfaces are not polished to a specular finish, as a result of the soft glass quickly hardening locally on contact with the mold surfaces, before it has time to conform to the surface roughness of the mold. This quick surface hardening also inhibits adhesion of the glass to the mold, while allowing approximately radial inward movement of the glass under the surfaces, while it remains for a short time soft and mobile.

A finite element model of a quarter section of a single lens of a multi-lens array has been developed. The model includes calculation of heat transfer and viscous flow, with the viscosity dependent on temperature. The model takes advantage of symmetry considerations, with the boundary condition of zero flow velocity perpendicular to the quadrant boundaries. The mold material is 410 stainless steel. The glass is low-iron soda-lime float, with uniform initial thickness of 6 mm, matching the optical design of Table 1. The upper mold near the lens array corners, and also the whole lower mold, are intentionally made thin, to reduce thermal inertia and prevent excessive rapid hardening. The lower mold 16 is modeled as being faced with a 1 mm thick sheet of the insulator Macor, for the same reason.

Figure 13:
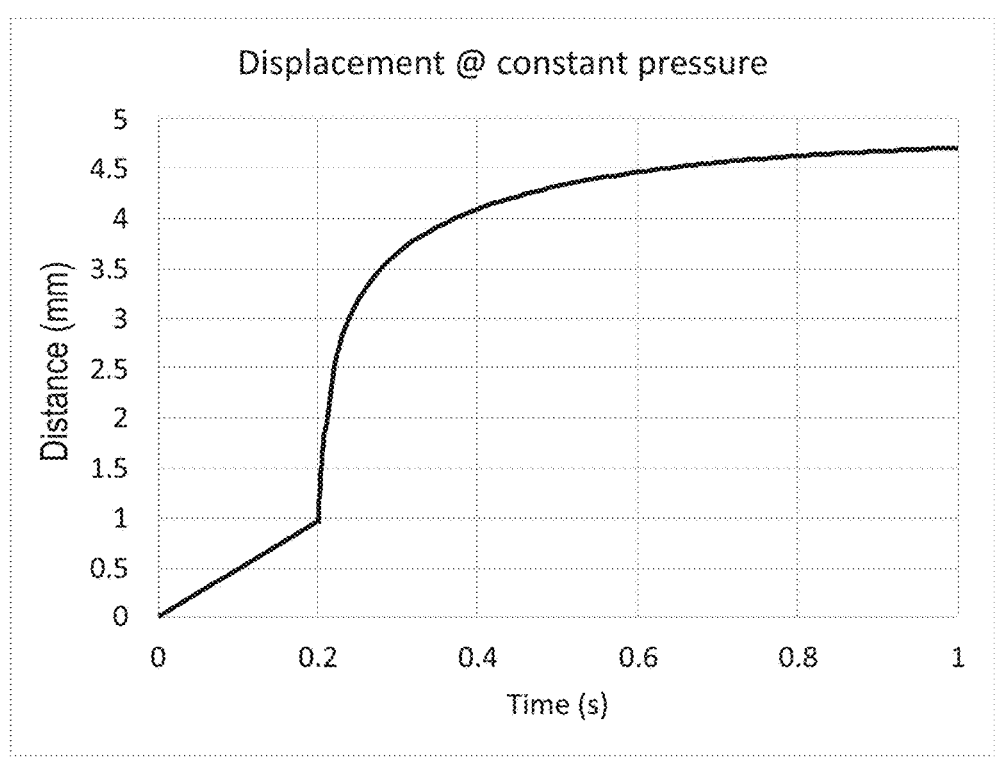
FIG. 13 is a plot of mold descent vs. time, under constant pressure, from finite element model.

In this example, the modeled glass starting temperature is 880° C., and the mold starting temperature 550° C. The applied pressure is 0.86 MPa (125 psi) when the time required to form a lens array is 1 second. FIG. 13 shows the downward movement of the upper mold during this forming interval. FIG. 12B shows a 3-D representation of the temperature of the glass immediately after the formation, with temperature around the boundary represented by gray scale. The glass that has just reached the crown 36 is still relatively hot at 802° C., with low viscosity: At the corners 39 between four lenses, where the glass initially contacted the upper mold, the glass temperature has cooled to 600 C, when its viscosity is considerably higher.

Figure 14:
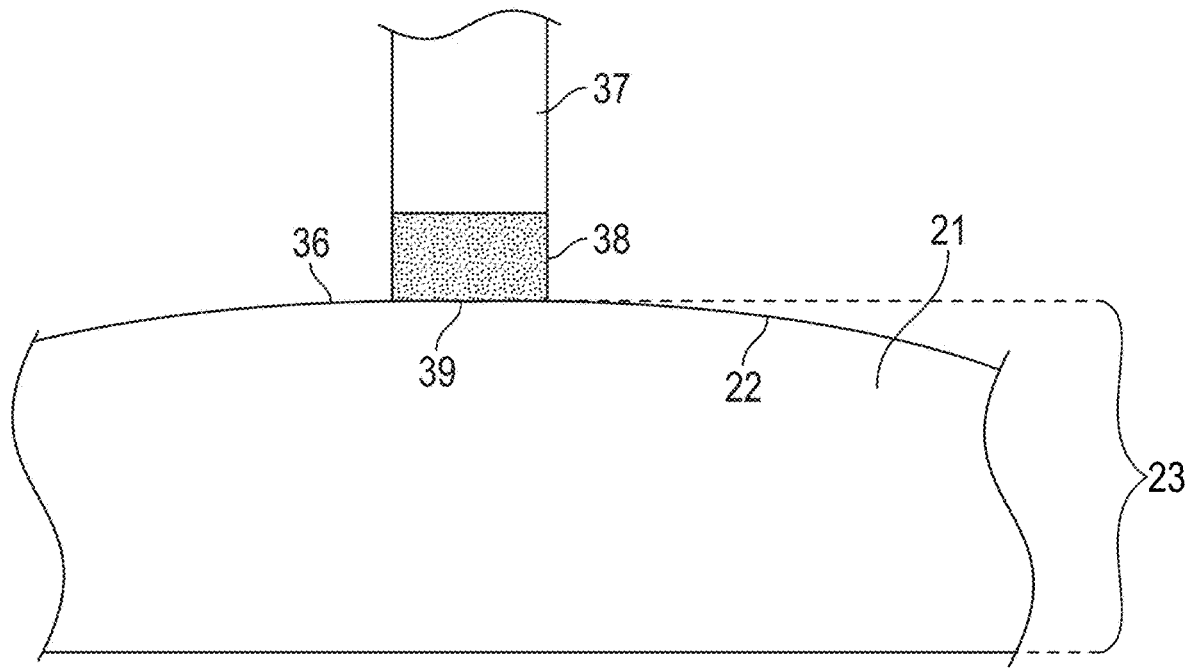
FIG. 14 shows central detail of an upper mold surface with vent hole according to an embodiment of the current invention.

FIG. 14 shows a detail on completion of molding in the region of the crown 36 of the surface 22 of one of the molded lenses 23 of the array. Pressure applied to the softened glass 21 has driven it to fill the mold to the top 36 of the crown, driving out gas through the hole 37. But penetration of the glass itself, beyond the surface curve 39 shown, is prevented by a porous plug 38 with micron-scale openings. These are small enough to prevent the glass from penetrating, but large enough to allow passage of gas. Because the plug area, for a plug diameter of around 1 mm, is only about 0.1% that of the lens, the fraction of light lost at the plug is not significant.

Figures 15A, 15B:
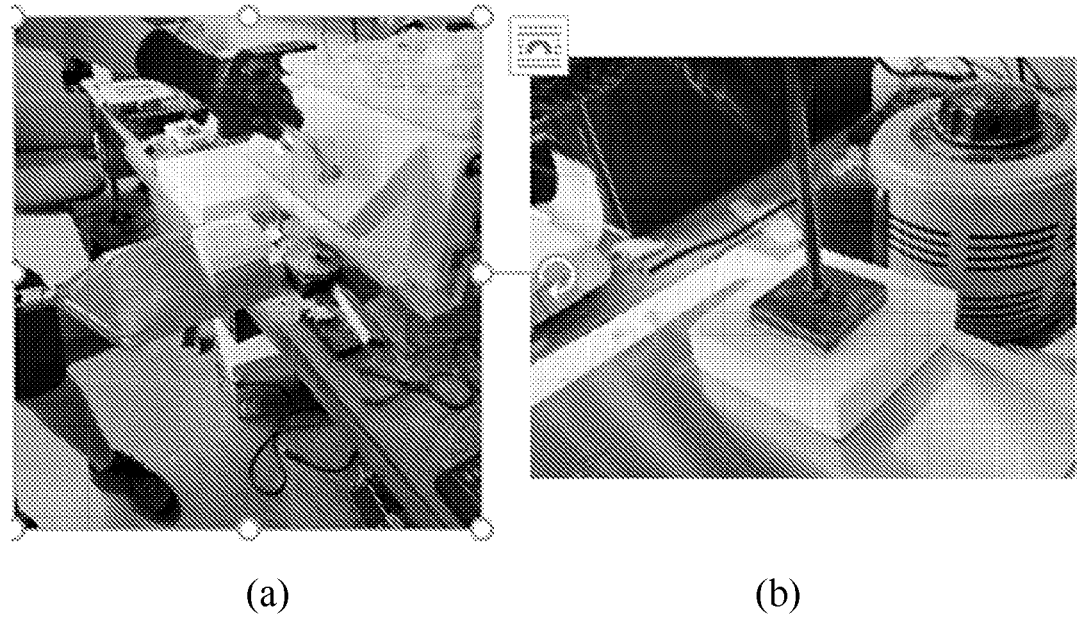
FIGS. 15A-15B are photographs of soda-lime glass molding, (a) heated glass being removed from furnace, (b) after molding according to an embodiment of the current invention.
Figure 16:
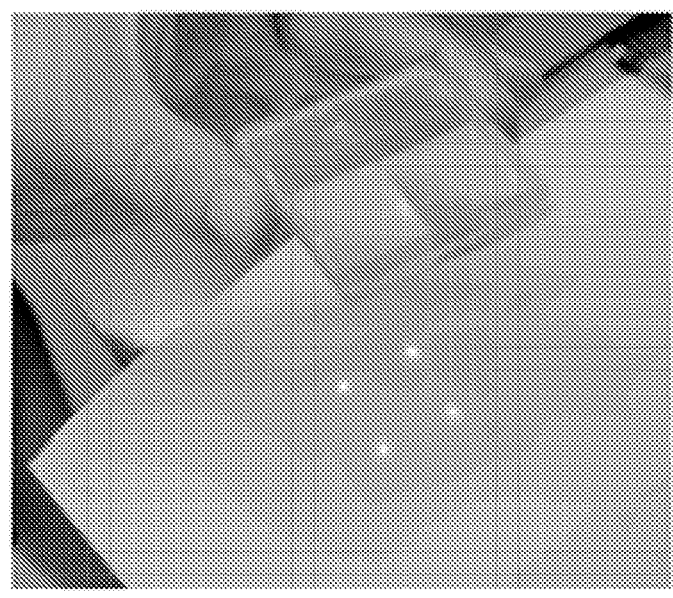
FIG. 16 shows points of light focused by molded cylindrical lenses according to an embodiment of the current invention.

FIGS. 15A-15B show a small-scale test in which a pair of side-by-side cylindrical lenses were molded in soda-lime float glass in less than 10 seconds. The glass was heated to 850° C. and then brought out of the furnace, as shown in FIG. 15A, before being pressed by a non-specular steel mold at initially 450° C., as shown in FIG. 15B, to form the lens pair. FIG. 16, shows two of these lens pairs, optically bonded at right angles, focusing a beam of collimated light to form high-concentration point foci, illustrating that the molded lens surfaces are well-shaped, and specular.

While various embodiments of the present invention have been described above, it should be understood that they have been presented by way of example only, and not limitation. Thus, the breadth and scope of the present invention should not be limited by any of the above-described illustrative embodiments, but should instead be defined only in accordance with the following claims and their equivalents.

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments of the disclosure may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present disclosure contemplates that, to the extent possible, one or more features of any embodiment can be combined with one or more features of any other embodiment.

We claim:

1. A hybrid photovoltaic (PV) module, comprising:
   a bifacial PV module comprising an upper sheet of glass, a lower sheet of glass arranged spaced apart and substantially parallel to said upper sheet of glass, and a plurality of PV cells sandwiched between said upper and lower sheets of glass, said upper sheet of glass having an outside surface on an opposite side from said plurality of PV cells;
   a plurality of copper wires bonded to the outside surface of said upper sheet of glass so as to extend across a width thereof;
   a plurality of multijunction (MJ) PV cell assemblies positioned and bonded to said outside surface of said upper glass sheet, each MJ cell assembly of said plurality of MJ cell assemblies comprising an MJ cell, a secondary optical assembly and first and second conductive connectors, each being electrically and thermally connected to said MJ cell and to at least a respective one of said plurality of copper wires; and
   an upper lens array of a full size of said bifacial PV module and being attached in position there above,
   wherein, when said hybridized PV module is oriented to face the sun, each lens of said upper lens array focuses direct sunlight onto a respective one of said plurality of MJ cell assemblies while transmitting diffuse light to said bifacial PV module, and
   wherein said copper wires and connectors are structured to provide at least two functions, namely to:
   conduct electrical power of said MJ cells to a perimeter of said hybrid PV module and thence via additional electrical wiring to an external circuit, and
   conduct and spread heat from said plurality of MJ cell assemblies across said upper sheet of glass of said bifacial PV module so that the module serves as a heat sink for said plurality of MJ cells assemblies thereby providing passive convective cooling from said lower sheet of glass and thus preventing overheating and increasing optical to electrical conversion efficiency, without incurring an added complexity and cost of added heat sinks or active cooling and parasitic electrical power loss.

2. The hybrid PV module according to claim 1, wherein each copper wire of said plurality of copper wires have at least one of a square or rectangular cross section, are untwisted, and have one of their four sides bonded to the outside surface of said upper sheet of glass with a thin layer of thermally conducting adhesive, and
   wherein heat transfer from each copper wire of said plurality of copper wires to said bifacial module is maximized.

3. The hybrid PV module according to claim 1, further comprising mirrored side panels attached to edges of said upper lens array and of said bifacial module, said side panels being arranged to reflect additional diffuse light onto said bifacial PV module.

\* \* \* \* \*